US006442011B1

(12) United States Patent
Attarian et al.

(10) Patent No.: US 6,442,011 B1
(45) Date of Patent: Aug. 27, 2002

(54) FLUX CONCENTRATION ADJUSTMENT MECHANISM AND METHOD FOR HALL EFFECT SENSORS AND CIRCUIT BREAKER USING SAME

(75) Inventors: Farshid Attarian, Collinsville; Joseph Criniti, New Britain; Alberto A. Figueroa, Southington; Javier Ignacio Larranaga, Bristol; Esteban Santos, Farmington, all of CT (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 09/566,599

(22) Filed: May 8, 2000

(51) Int. Cl.[7] ............................ H02H 3/00; H01L 43/06
(52) U.S. Cl. .................... 361/93.1; 361/111; 361/115; 361/102; 361/170; 324/207.2; 324/117 H
(58) Field of Search .................... 361/93.1, 93.6, 361/102, 111, 179, 170, 115, 173; 324/207.2, 220, 228, 246, 260, 117 H; 307/116; 340/650, 651, 664

(56) References Cited

U.S. PATENT DOCUMENTS

| | | | |
|---|---|---|---|
| 5,014,043 A | * | 5/1991 | Lopetrone et al. .......... 340/664 |
| 5,321,355 A | * | 6/1994 | Luetzow ................... 324/207.2 |
| 5,723,789 A | * | 3/1998 | Shannon ................... 73/514.31 |
| 6,108,185 A | * | 8/2000 | Kim et al. ................... 361/115 |
| 6,175,229 B1 | * | 1/2001 | Becker et al. .......... 324/117 H |

* cited by examiner

*Primary Examiner*—Kim Huynh
(74) *Attorney, Agent, or Firm*—Cantor Colburn LLP

(57) ABSTRACT

A Hall effect sensor is transported to and away from a conductor to vary the sensitivity range of the sensor to current flow in the conductor. The device comprises a bracket supported on the conductor which holds a jack screw. At the lower end of the jack screw is a sensor block which holds the Hall effect sensor. The sensor block translates in a slide guide of the bracket, but is prevented from rotating. At the upper end of the jack screw is a knob for rotating the jack screw. Rotating the jack screw causes the sensor block to slide closer or farther from the conductor, which varies its sensitivity in measuring a magnetic field generated by a current in the conductor.

20 Claims, 3 Drawing Sheets

FLUX CONCENTRATION ADJUSTMENT MECHANISM AND METHOD FOR HALL EFFECT SENSORS AND CIRCUIT BREAKER USING SAME

BACKGROUND OF THE INVENTION

Hall effect sensors for detecting motion, direction, position, and measuring/monitoring electric current have become increasingly popular over the last decade as advances in sensor design have been made. Hall effect Sensors develop an output signal proportional to the applied magnetic field, such as one generated by a current through a conductor. However, their operational range is limited. For the current to be effectively monitored, the sensor must be positioned with respect to the power conductor such that the magnetic field generated by current is within the operational range of the sensor. The closer the Hall effect sensor is to the power conductor's surface, the stronger the flux concentration available for the sensor.

Prior to the present invention, sensors have been fixed relative to the conductor to which they are coupled. This permitted accurate positioning of the sensor which is critical for precise measurements, but the fixed position reduces its versatility, since the device can only measure currents within a specified range.

BRIEF SUMMARY OF THE INVENTION

The present invention resolves the disadvantages noted above by providing an accurate positioning mechanism for a Hall effect sensor relative to a conductor. The proposed mechanism to achieve accurate positioning with respect to the power conductor's magnetic field is designed to allow the manual displacement of the sensor in a graduated manner. The sensor(s) will be transported inside a bracket that prevents the rotational or other unwanted motion of the sensor body while a screw generates the linear motion necessary for linear displacement of the sensor with respect to the conductor. Each turn of the screw allows for a specific distance of travel. In this way, the invention presents a simple mechanism for providing fine-adjustment and accurate positioning of a Hall effect sensor.

In addition, the invention presents a method for accurately calibrating the mechanism to provide a high degree of precision in positioning the Hall effect sensor for precise measurement of magnetic flux.

DETAILED DESCRIPTION OF THE INVENTION

Figure 1:
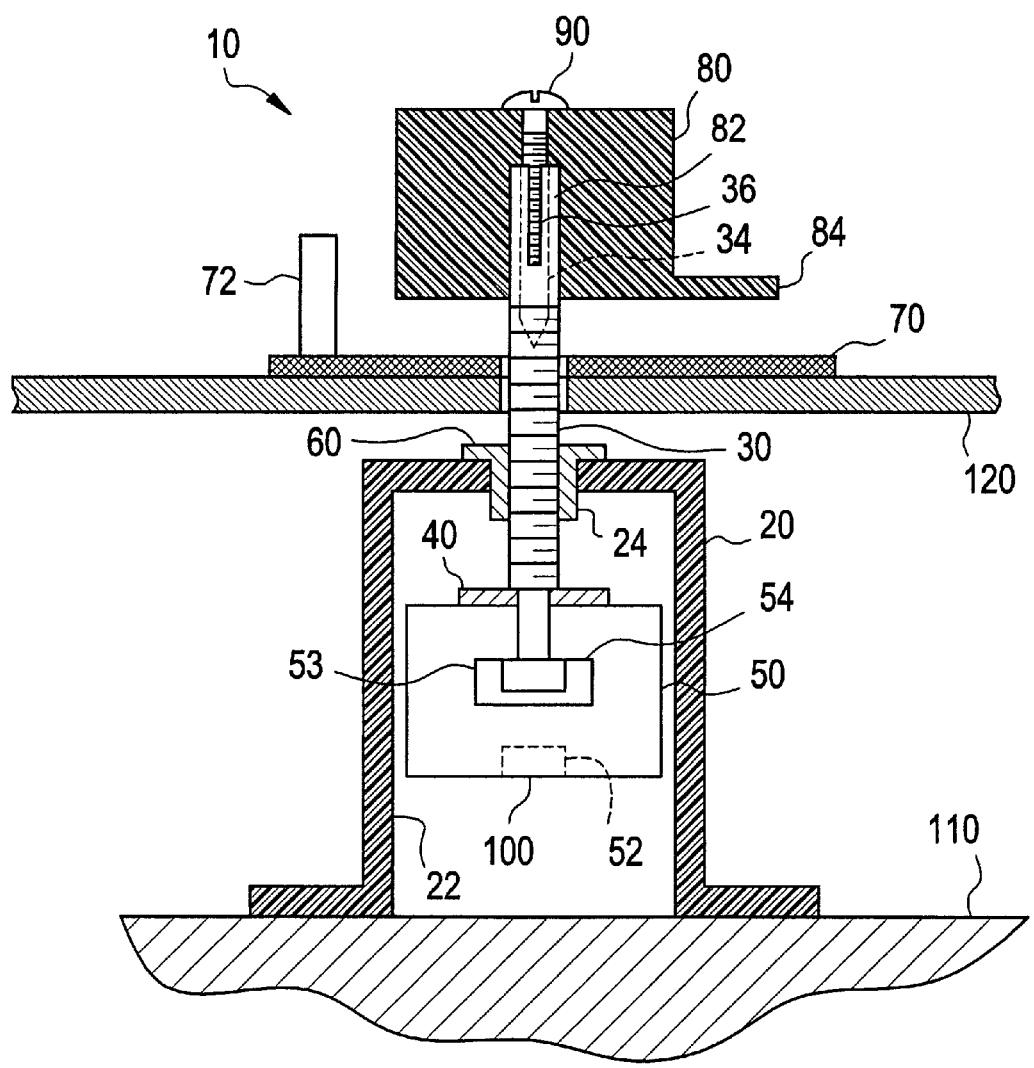
FIG. 1 shows a preferred embodiment according to the invention.
Figure 2:
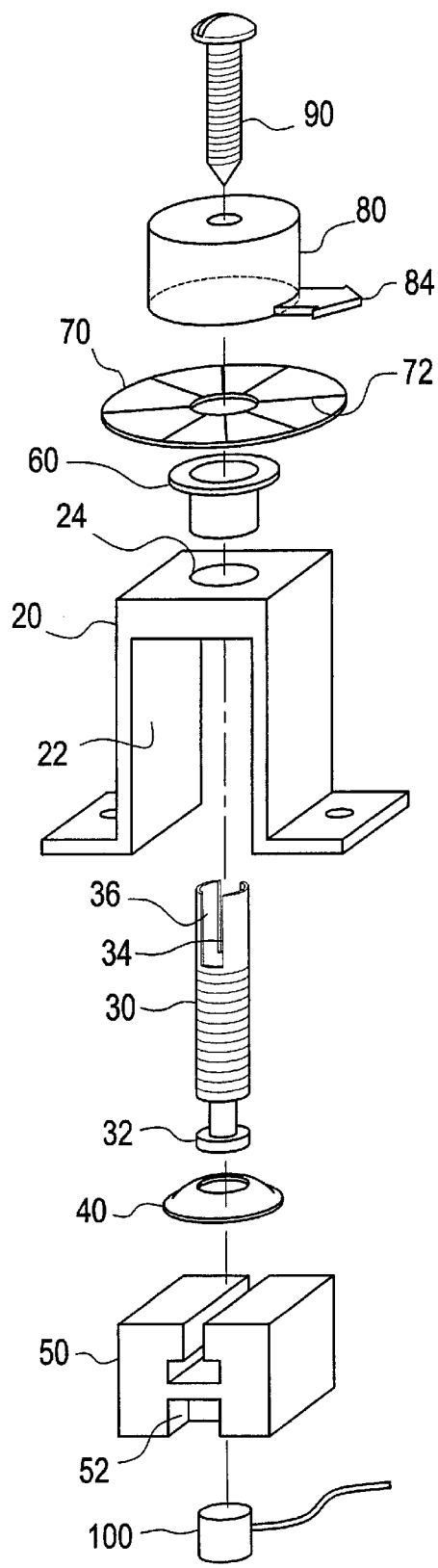
FIG. 2 shows the embodiment of FIG. 1 in exploded view.

Referring now to the drawings wherein FIGS. 1 and 2 show a preferred embodiment of the adjustment mechanism generally at 10. Sensor 100 will be transported inside bracket 20 that prevents the rotational or other unwanted motion of the sensor body while jack screw 30 generates the linear motion necessary for linear displacement of sensor 100 with respect to conductor 110. Each turn of jack screw 30 allows for a specific distance of travel. For example, a screw having 24 threads per inch (cm) will provide 0.0417 inches (cm) of movement in one full turn of the screw.

Slide block 50, formed from a molded high-temperature thermoplastic, transports Hall effect sensor 100 in recess 52 of the sensor block. Hall effect sensor 100 may be attached to the slide block using a high temperature epoxy. The slide block travels up and down in slide guide 22 of bracket 20, which is also formed from molded thermoplastic. Bracket 20 may contain multiple slide guides for multiple slide blocks (and multiple Hall effect sensors).

Slide block 50 is positioned in the bracket by jack screw 30. Sensor slide block 50 is provided with an inverted T-slot section 53. T-slot 53 captures tip 32 of the jack screw 30 and allows screw tip 32 to turn against shoulders 54 of T-slot 53 as jack screw 30 is adjusted while slide guides 22 prevent rotation of slide block 50. The slide block 50 may be turned 90 degrees from the position shown in FIG. 1 during assembly to prevent it from sliding off jack screw 30 or additional surfaces (not shown) may be employed for this task. The slot height in relation to screw tip 32 is critical so no uncontrolled vertical motion is created. To prevent any manufacturing tolerances from creating play resulting in unwanted vertical motion, spring washer 40 is assembled between screw post body and slide block 50.

Jack screw 30 is threaded into mating threaded insert 60 held in place by bracket 20. At the upper end of jack screw 30 is an internal thread 34 and slot 36, which extends in a plane passing through the axis of the jack screw 30 from the top end of jack screw 30 to a predetermined depth. The outside diameter of the slotted section of jack screw 30 is very close to the inside diameter of adjustment knob 80. Adjustment knob 80 is installed over the slotted section of jack screw 30 as shown in FIG. 1 and set screw 90 is screwed into internal threads 32 of jack screw 30. As set screw 90 is screwed into jack screw 30, the two sections created by slot 34 will start to spread and press against inner wall 82 of adjustment knob 80. This action will set the assembly together, allowing knob 80 and jack screw 30 to turn as one.

Knob 80 includes combination stop pointer 84. The stop is used to prevent jack screw 30 from rotating more than a predetermined angle, such as 350 degrees. The pointer helps the user find the correct position with respect to indicator label 70. Indicator label 70 is permanently positioned underneath adjustment knob 80, and is provided with graduation marks and provided with markings to indicate the appropriate perimeter distance from one graduation mark to another. For example, label 70 may be marked with graduation marks and indicating markings showing a scale from 0.5x to 2.5x.

As knob 80 is turned counter-clockwise, sensor 100 is moved farther from conductor 110, and the milli-volt output of sensor 100 will drop. Label 70 is therefore marked starting with lower levels and moving clockwise to the higher levels.

The method of assembling the device will now be explained. First, insert 60 is pressed into receiving hole 24 of frame 20 and spring washer 40 is assembled onto the tip 32 of screw 30. Tip 32 of screw 30 is then inserted into T-slot 53 of sensor block 50. Jack screw 30 is then threaded in insert 60. Bracket 20 is then installed onto conductor 110. Circuit breaker housing 120 is then installed over bracket 20. Circular label 70 is then installed onto circuit breaker housing 120. Then a calibration procedure is performed (described in more detail below). The adjusting knob is then installed with set screw 90 to lock knob 80 to jack screw 30. Finally the unit is tested at all graduated points to millivolt output.

Calibration Procedure

Calibration is performed before adjusting knob 80 is installed. Once assembled with the cover on, the output of the Hall sensor is tapped and the jack screw 30 is brought all the way down so the face of sensor 100 is against the face of conductor 110. At this point sensor 100 must have the desired figure (in millivolts) or higher than the desired figure. If higher, jack screw 30 will be turned away from the conductor slowly until the desired value is reached. Adjusting knob 80 will be inserted and held down and against stop pin 72 so indicator 84 points to the correct high reading on graduated dial 70. Set screw 90 will then be installed locking knob 80 into position. Once this calibration has been performed, a check of all values in the range must be performed. This check must yield the appropriate readings for each value.

Circuit

Figure 3:
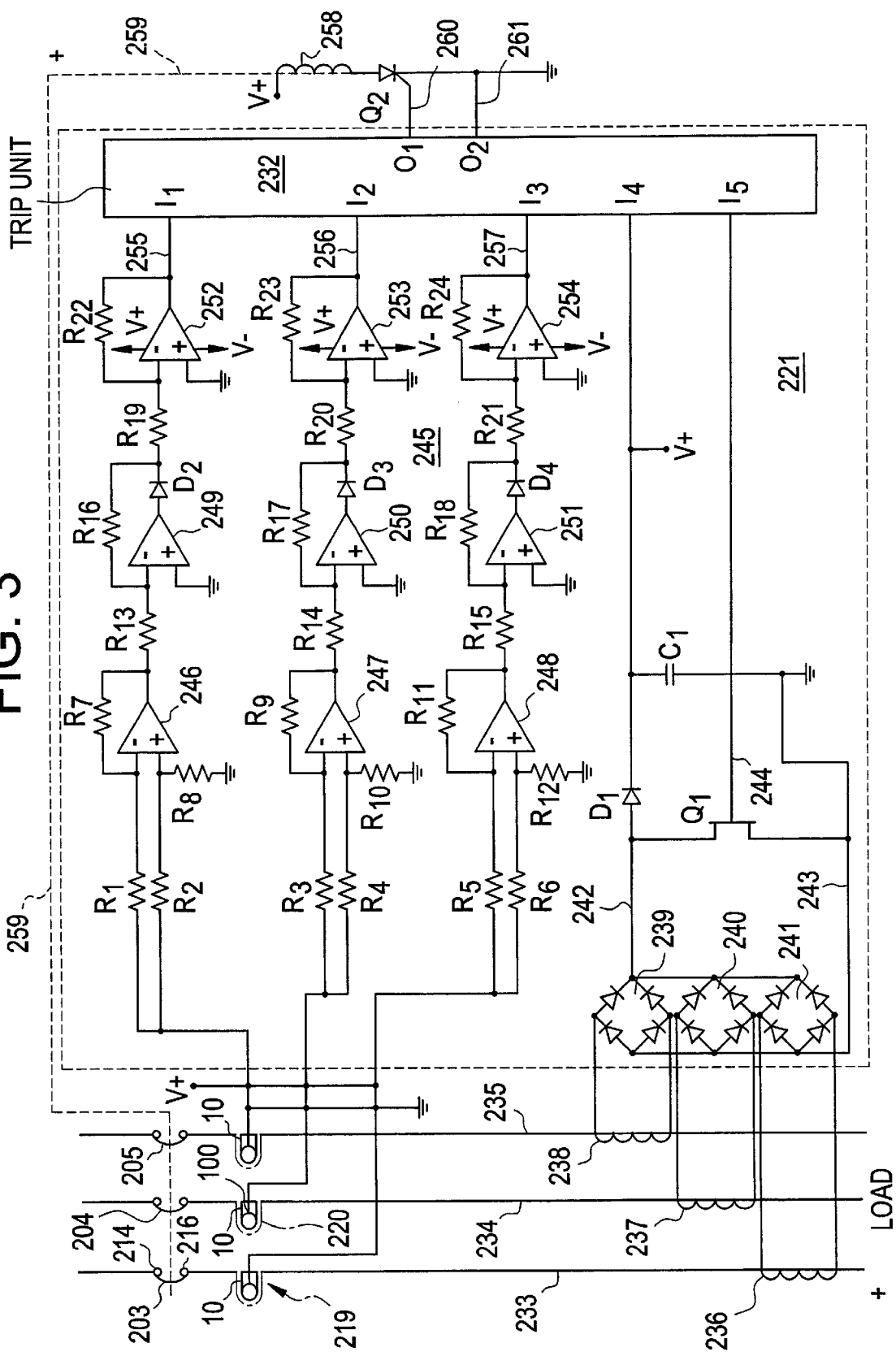
FIG. 3 shows an exemplary circuit employing the sensor of the present invention.

FIG. 3 shows an exemplary application of the Hall effect sensor and adjustment mechanism 10 of the preferred embodiment. This circuit includes printed circuit board 221 upon which trip unit 232 is mounted. The electrical contacts 214, 216 are shown connected within a three phase electrical distribution system that includes conductors 233, 234, 235 and the shaped load lugs 219 depicted in phantom, encompass the corresponding Hall sensor 100 within the shaped radial extension 220 within each separate phase. Hall sensors 100 are positioned relative to radial extensions 220 of conductors 233, 234, and 235 by adjustment mechanisms 10. Three miniature current transformers 236–238 are connected within each phase to provide operating power to input ports $I_4$ and $I_5$ of the trip unit circuit 232 by means of three separate bridge rectifiers 239–241, conductors 242, 243, and 244, diode $D_1$, FET $Q_1$ and capacitor $C_1$.

The conditioning circuit 245 connects between the Hall sensors 100 and the input ports $I_1$–$I_3$ of trip unit 232 and includes current limiting resistors $R_1$–$R_6$, feedback resistors $R_7$, $R_9$, $R_{11}$ and ground resistors $R_8$, $R_{10}$, $R_{12}$ connecting with OP AMPs 246–248 in an amplifying stage of the conditioning circuit. The OP AMPs 246–248 connect with OP AMPs 249–251 through limiting resistors $R_{13}$–$R_{15}$ and feed-back resistors $R_{16}R_{18}$ in a rectification stage. Finally, OP AMPs 252–254 connect the input ports $I_1$–$I_3$ of the trip unit 232 through resistors $R_{19}$–$R_{24}$, rectifying diodes $D_2$–$D_4$ and conductors 255, 256, and 257 to complete the inverter stage of the conditioning circuit 245.

The signals inputted from the Hall sensors 100 through the conditioning circuit 245 are processed within the trip unit circuit 232 to determine instantaneous, short time and long time overcurrent conditions in the manner described in U.S. Pat. No. 5,615,075, incorporated herein by reference and a trip signal is outputted over conductor 260 to the gate of switching transistor $Q_2$ to energize the trip solenoid 258 via output port $O_1$. The cathode of $Q_2$ connects with ground through conductor 261 and output port $O_2$ to complete the circuit to trip solenoid 258. Solenoid 258 operates over mechanical actuator arm 259 to electrically isolate and separate movable electrical contacts 203, 204, 205 within each of the conductors 233–235 to interrupt the circuit within each phase of the electrical distribution circuit.

While a preferred embodiment of a trip unit Hall effect sensor adjustment mechanism has been shown and described, various modifications and substitutions may be made thereto without departing from the spirit and scope of the invention. Accordingly, it is to be understood that the present invention has been described by way of illustrations and not limitation.

What is claimed is:

1. A device for adjusting displacement of a Hall effect sensor from a conductor comprising:
    a bracket fixed with respect to a conductor, the bracket having a slide guide;
    a movable sensor block positioned above the conductor within the slide guide, the slide guide preventing rotation of the sensor block;
    a jack screw having threads along its body engaging corresponding threads supported on said bracket, said jack screw having a connection at its lower end, said connection preventing vertical displacement of said sensor block with respect to said jack screw, but allowing said jack screw to rotate with respect to said sensor block;
    a Hall effect sensor attached at a lower end of said sensor block.

2. The device of claim 1 wherein said sensor block includes an inverted T-slot formed into its top and said connection comprises screw tip of increased diameter which in engagement with said T-slot.

3. The device of claim 2 wherein said jack screw includes a region of reduced diameter adjacent said tip, the device further comprising a spring washer disposed between a shoulder formed at an upper limit of said region of reduced diameter and said sensor block, said spring washer preventing play in said sensor block caused by manufacturing tolerances.

4. The device of claim 1 wherein said threads supported on said bracket are formed in an insert which is supported by said bracket.

5. The device of claim 1 wherein said bracket and said sensor block are formed from high-temperature thermoplastic.

6. The device of claim 1, wherein said jack screw further comprises:
    a slot formed in its upper end, said slot extending in a plane coincident with an axis of said jack screw and extending in a predetermined depth from the top of said jack screw, said slot dividing said upper end into two sections and
    internal threads extending from the top of said jack screw to a predetermined depth within said jack screw;
    said device further comprising;
        a knob having a first hole extending from a bottom of said knob to a predetermined depth within said knob, said first hole having an inside diameter that is close to the outside diameter of said jack screw and a second hole extending from the top of said knob to the first hole, said second hole having a smaller diameter than said first hole; and
        a set screw, said set screw extending from the top of said knob through said second hole and into said top of said jack screw, engaging said internal threads in said jack screw, said set screw pressing said sections against inside surface of said first hole of said knob, thereby locking said knob to said jack screw so that they turn as one.

7. The device of claim 6 wherein said knob includes a combination pointer and stop for indicating on a dial label the ratio of millivolts output from said sensor to current in said conductor, said ratio varying with the distance between said conductor and said Hall effect sensor.

8. An electronic circuit breaker unit comprising
    separable contacts connected on a power conductor between a power source and a load,
    a bracket fixed with respect to said conductor, the bracket having a slide guide;
    a movable sensor block positioned above the conductor within the slide guide, the slide guide preventing rotation of the sensor block;

a jack screw having threads along its body engaging corresponding threads supported on said bracket, said jack screw having a connection at its lower end, said connection preventing vertical displacement of said sensor block with respect to said jack screw, but allowing said jack screw to rotate with respect to said sensor block;

a Hall effect sensor attached at a lower end of said sensor block sensing magnetic field generated by a current flowing in said conductor and generating a signal indicative of said magnetic field;

a trip unit utilizing said signal to determine if a fault condition exists, and upon sensing such fault condition, separating said separable contacts.

9. The electronic circuit breaker unit of claim 8 wherein said sensor block includes an inverted T-slot formed into its top and said connection comprises screw tip of increased diameter which in engagement with said T-slot.

10. The electronic circuit breaker unit of claim 9 wherein said jack screw includes a region of reduced diameter adjacent said tip, the device further comprising a spring washer disposed between a shoulder formed at an upper limit of said region of reduced diameter and said sensor block, said spring washer preventing play in said sensor block caused by manufacturing tolerances.

11. The electronic circuit breaker unit of claim 8 wherein said threads supported on said bracket are formed in an insert which is supported by said bracket.

12. The electronic circuit breaker unit of claim 8 wherein said bracket and said sensor block are formed from high-temperature thermoplastic.

13. The electronic circuit breaker unit of claim 8, wherein said jack screw further comprises:

a slot formed in its upper end, said slot extending in a plane coincident with an axis of said jack screw and extending in a predetermined depth from the top of said jack screw, said slot dividing said upper end into two sections and internal threads extending from the top of said jack screw to a predetermined depth within said jack screw;

said device further comprising;

a knob having a first hole extending from a bottom of said knob to a predetermined depth within said knob, said first hole having an inside diameter that is close to the outside diameter of said jack screw and a second hole extending from the top of said knob to the first hole, said second hole having a smaller diameter than said first hole; and a set screw, said set screw extending from the top of said knob through said second hole and into said top of said jack screw, engaging said internal threads in said jack screw, said set screw pressing said sections against inside surface of said first hole of said knob, thereby locking said knob to said jack screw so that they turn as one.

14. The electronic circuit breaker unit of claim 13 wherein said knob includes a combination pointer and stop for indicating on a dial label the ratio of millivolts output from said sensor to current in said conductor, said ratio varying with the distance between said conductor and said Hall effect sensor.

15. A method of varying the sensitivity range of a Hall effect sensor comprising:

placing said Hall effect sensor in a sensor block;

connecting the sensor block to a jack screw;

threading the jack screw to cooperating threads supported by a bracket and placing the sensor block in a slide guide also supported by said bracket such that rotation of the jack screw causes translation of the sensor block within the slide guide;

fixing the bracket with respect to a conductor; and adjusting the distance between the conductor and the Hall effect sensor by turning the jack screw.

16. The method of claim 15 wherein said adjusting comprises:

tapping the output of the Hall effect sensor to determine an output voltage and rotating the jack screw until the face of the sensor is against the conductor face;

rotating the jack screw away from the conductor until a desired output voltage is reached;

installing an adjustment knob on an end of the jack screw opposite the sensor block; and fixing said adjustment knob on said jack screw so that the two turn as one.

17. The method of claim 16 wherein said indicator functions as a stop and points to graduations on a fixed label; said label including a stop pin preventing the knob from making a complete rotation; said installing further comprises placing said indicator against said stop pin.

18. The method of claim 15 wherein said threading includes attaching a threaded insert onto said bracket and threading said jack screw through said threaded insert.

19. The method of claim 15 wherein said connecting includes inserting a spring washer between an annular shoulder formed on said jack screw and said sensor block to prevent any play between the jack screw and the sensor block.

20. The method of claim 15 further comprising:

connecting an output of said Hall effect sensor to a trip unit;

utilizing an output of said Hall effect sensor to determine if a fault condition exists, and upon detecting such a fault condition, separating separable contacts connected to said conductor.

* * * * *